(12) United States Patent
Hong et al.

(10) Patent No.: US 11,791,211 B2
(45) Date of Patent: Oct. 17, 2023

(54) SEMICONDUCTOR DEVICES INCLUDING THROUGH VIAS AND METHODS OF FABRICATING THE SAME

(71) Applicant: Samsung Electronics Co., Ltd., Suwon-si (KR)

(72) Inventors: Yi Koan Hong, Yongin-si (KR); Taeseong Kim, Suwon-si (KR); Kwangjin Moon, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 49 days.

(21) Appl. No.: 17/691,178

(22) Filed: Mar. 10, 2022

(65) Prior Publication Data

US 2022/0199469 A1 Jun. 23, 2022

Related U.S. Application Data

(63) Continuation of application No. 16/734,456, filed on Jan. 6, 2020, now Pat. No. 11,295,981.

(30) Foreign Application Priority Data

May 28, 2019 (KR) ........................ 10-2019-0062329

(51) Int. Cl.
*H01L 21/768* (2006.01)
*H01L 21/02* (2006.01)

(52) U.S. Cl.
CPC .. *H01L 21/76898* (2013.01); *H01L 21/02068* (2013.01); *H01L 21/76831* (2013.01)

(58) Field of Classification Search
CPC ......... H01L 21/02068; H01L 21/76898; H01L 23/481; H01L 21/76831; H01L 21/02063; H01L 2224/14181; H01L 21/76814
(Continued)

(56) References Cited

U.S. PATENT DOCUMENTS 6,538,324 B1 * 3/2003 Tagami ............. H01L 21/76862
257/762
8,039,386 B1 10/2011 Dao et al.
(Continued)

FOREIGN PATENT DOCUMENTS

KR 20160110658 A 9/2016
KR 20180068595 A 6/2018

*Primary Examiner* — Hrayr A Sayadian
(74) *Attorney, Agent, or Firm* — Myers Bigel, P.A.

(57) ABSTRACT

Disclosed are semiconductor devices including through vias and methods of fabricating the same. The methods may include forming a first structure including a metal pattern and a second structure on the first structure. The metal pattern includes an upper surface facing the second structure. The methods may also include etching the second structure to form a via hole exposing the metal pattern, oxidizing a first etch residue in the via hole to convert the first etch residue into an oxidized first etch residue, and removing the oxidized first etch residue. After removing the oxidized first etch residue, the upper surface of the metal pattern may include a first portion that includes a recess and has a first surface roughness and a second portion that is different from the first portion and has a second surface roughness. The first surface roughness may be greater than the second surface roughness.

20 Claims, 14 Drawing Sheets

(58) Field of Classification Search
USPC .......................................................... 438/667
See application file for complete search history.

(56) References Cited

U.S. PATENT DOCUMENTS

| | | |
|---|---|---|
| 8,546,256 B2 | 10/2013 | Jung et al. |
| 8,647,440 B2 | 2/2014 | Kawamura et al. |
| 8,778,206 B2 | 7/2014 | Nishimura et al. |
| 9,852,955 B2 | 12/2017 | Gehles et al. |
| 9,859,191 B2 | 1/2018 | Lee et al. |
| 9,935,004 B2 | 4/2018 | Gouk et al. |
| 10,388,563 B2 | 8/2019 | Kim et al. |
| 2009/0108462 A1 | 4/2009 | Peters et al. |
| 2011/0067733 A1 | 3/2011 | Okamoto et al. |
| 2021/0225697 A1 | 7/2021 | Chen et al. |

* cited by examiner

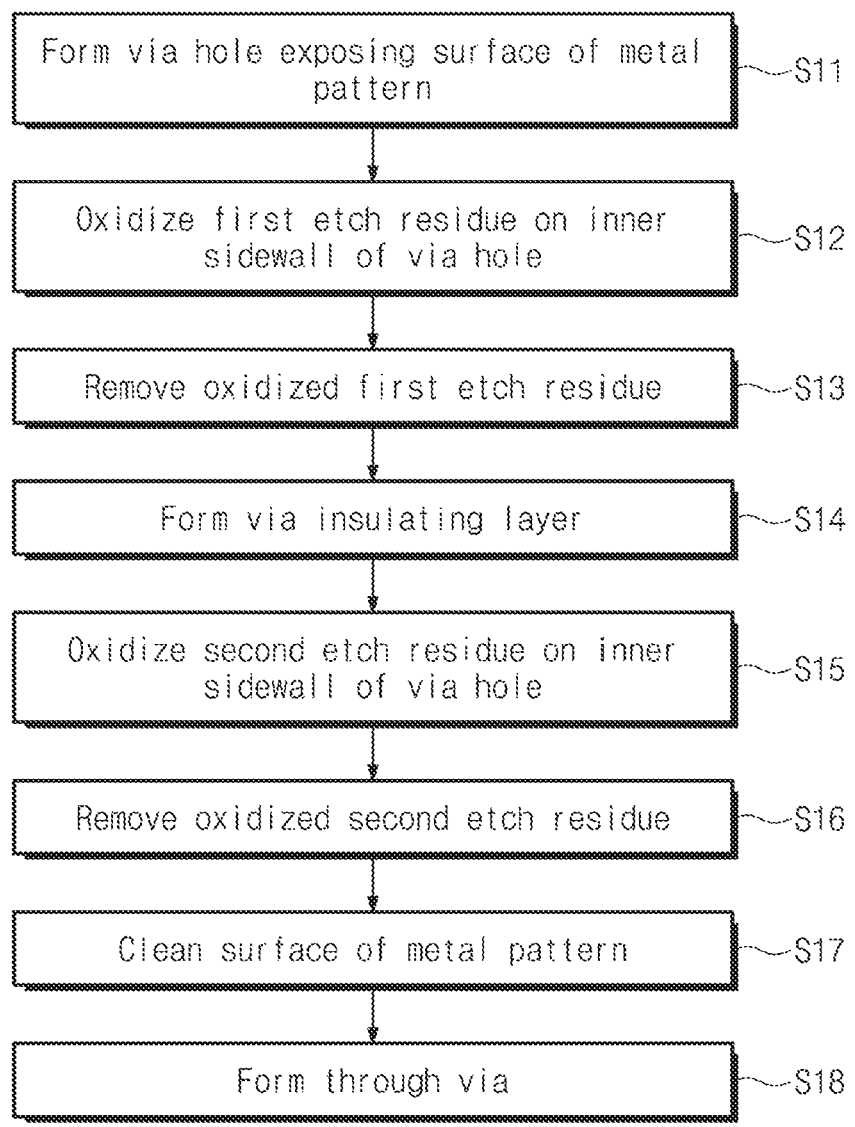

SEMICONDUCTOR DEVICES INCLUDING THROUGH VIAS AND METHODS OF FABRICATING THE SAME

CROSS-REFERENCE TO RELATED APPLICATION

This application is a continuation of U.S. patent application Ser. No. 16/734,456, filed Jan. 6, 2020, which claims priority under 35 U.S.C. § 119 to Korean Patent Application No. 10-2019-0062329, filed on May 28, 2019, in the Korean Intellectual Property Office, the disclosure of which is hereby incorporated by reference.

BACKGROUND OF THE INVENTION

The present disclosure relates to a semiconductor device including through vias and a method of fabricating the same.

In the electronics industry including devices such as a mobile phone or a laptop computer, there is an increasing demand for electronic devices with light weight, a small form factor, high speed, multifunction, high performance, and high reliability. To meet such a demand, a semiconductor package technology is being researched and developed. In the conventional interconnection technology of two-dimensionally connecting integrated circuits (ICs) using a wire-bonding method, there are several technical disadvantages, such as signal loss in wire, high power consumption, and constraint on design of a device. To overcome these disadvantages, a three-dimensional integrated circuit (3D-IC) package technology of connecting a plurality of stacked semiconductor chips with a vertical interconnection line was proposed. Here, the vertical interconnection line, which is used to vertically connect the semiconductor chips to each other, is called a through via, a through electrode, or a through-silicon-via (TSV). In the TSV-based 3D-IC package technology, it may be possible to place more ICs within a given area and to reduce lengths of wiring lines between circuits. Recently, a variety of research has been conducted to improve reliability and electric characteristics of semiconductor packages that are fabricated using the TSV-based 3D-IC package technology.

SUMMARY

Some embodiments of the inventive concept provide semiconductor devices with improved reliability.

Some embodiments of the inventive concept provide methods of fabricating a semiconductor device with improved reliability.

According to some embodiments of the inventive concept, semiconductor devices may include a first structure including a metal pattern, a second structure on the first structure, and a through via extending through the second structure. The through via may be electrically connected to the metal pattern. The metal pattern includes an upper surface facing the second structure, and the upper surface of the metal pattern includes a recess. The upper surface of the metal pattern includes a first portion that defines the recess and has a first surface roughness and a second portion that is different from the first portion and has a second surface roughness. The first surface roughness may be greater than the second surface roughness.

According to some embodiments of the inventive concept, methods of fabricating a semiconductor device may include forming a first structure including a metal pattern and a second structure on the first structure. The metal pattern includes an upper surface facing the second structure. The methods may also include etching the second structure to form a via hole exposing the metal pattern, oxidizing a first etch residue in the via hole to convert the first etch residue into an oxidized first etch residue, and removing the oxidized first etch residue. After removing the oxidized first etch residue, the upper surface of the metal pattern may include a first portion that includes a recess and has a first surface roughness and a second portion that is different from the first portion and has a second surface roughness. The first surface roughness may be greater than the second surface roughness.

According to some embodiments of the inventive concept, methods of fabricating a semiconductor device may include forming a first structure including a metal pattern and a second structure on the first structure, etching the second structure to form a via hole exposing the metal pattern, oxidizing a first etch residue in the via hole to convert the first etch residue into an oxidized first etch residue, and removing the oxidized first etch residue. Oxidizing the first etch residue may include forming a metal oxide on the metal pattern. The methods may also include reducing the metal oxide, before or after removing the oxidized first etch residue. Etching the second structure and oxidizing the first etch residue may be performed in-situ in a single process chamber.

According to some embodiments of the inventive concept, methods of fabricating a semiconductor device may include providing a first structure including a metal pattern and a second structure that is on the first structure. The metal pattern may include an upper surface facing the second structure. The methods may also include performing an etch process to form a hole in the second structure. The hole may expose the upper surface of the metal pattern. The methods may further include performing an oxidation process on the first structure and the second structure to oxidize a portion of the metal pattern exposed by the hole, reducing the portion of the metal pattern that is oxidized by performing the oxidation process, and performing a cleaning process on the first structure and the second structure after performing the oxidation process to clean the hole. The etch process and the oxidation process may be performed in-situ, and reducing the portion of the metal pattern may be performed before or after performing the cleaning process.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 3 is a process flow chart illustrating a method of fabricating a semiconductor device according to some embodiments of the inventive concept.

It should be noted that these figures are intended to illustrate the general characteristics of methods, structure and/or materials utilized in example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concept will now be described more fully with reference to the accompanying drawings, in which example embodiments are shown.

Figure 1A:
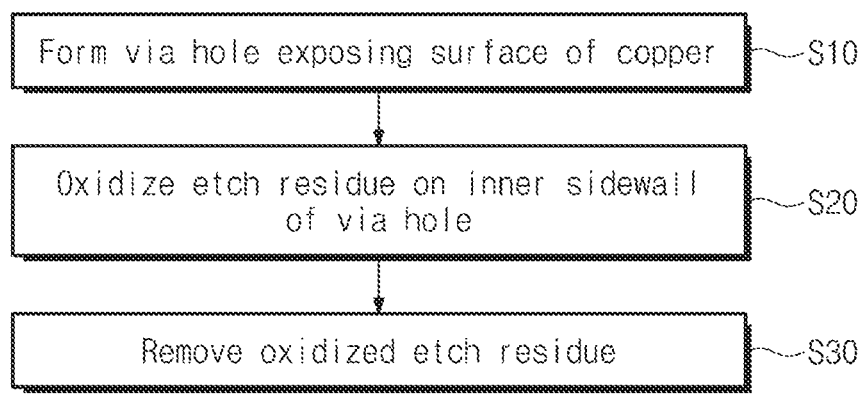
FIGS. 1A to 1C are process flow charts illustrating methods of fabricating a semiconductor device, according to some embodiments of the inventive concept.
Figure 1B:
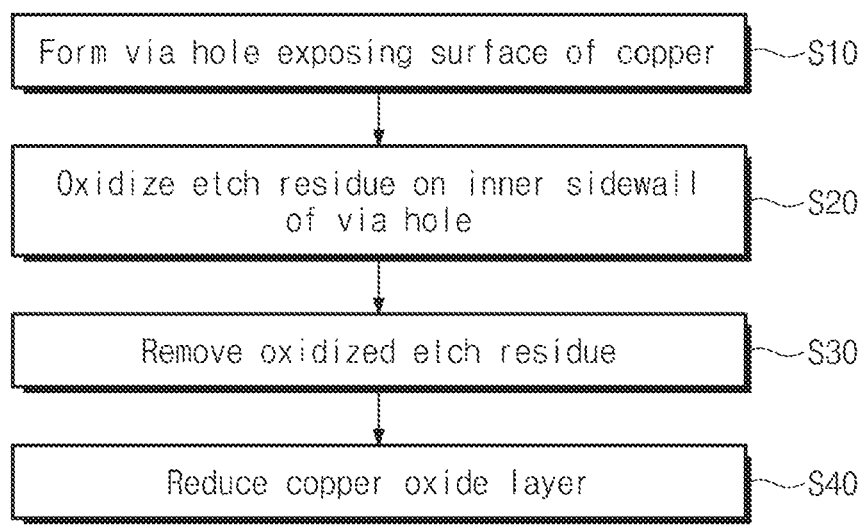
Figure 1C:
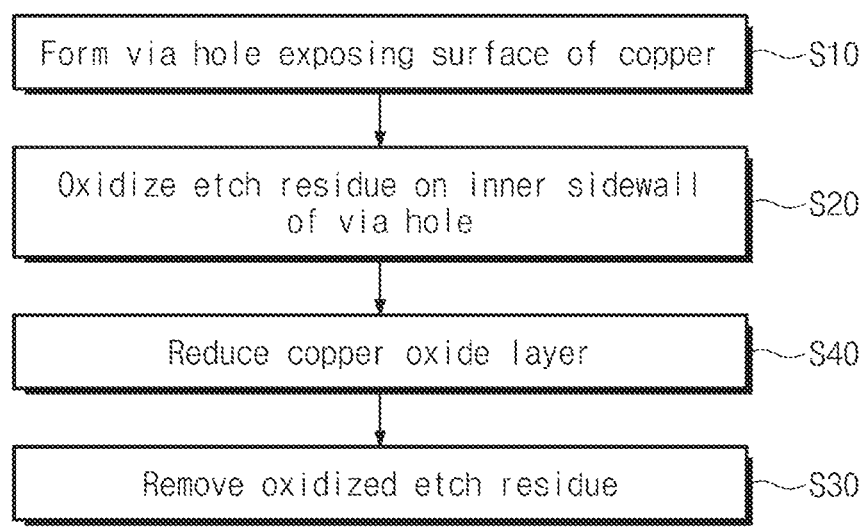
Figure 2A:
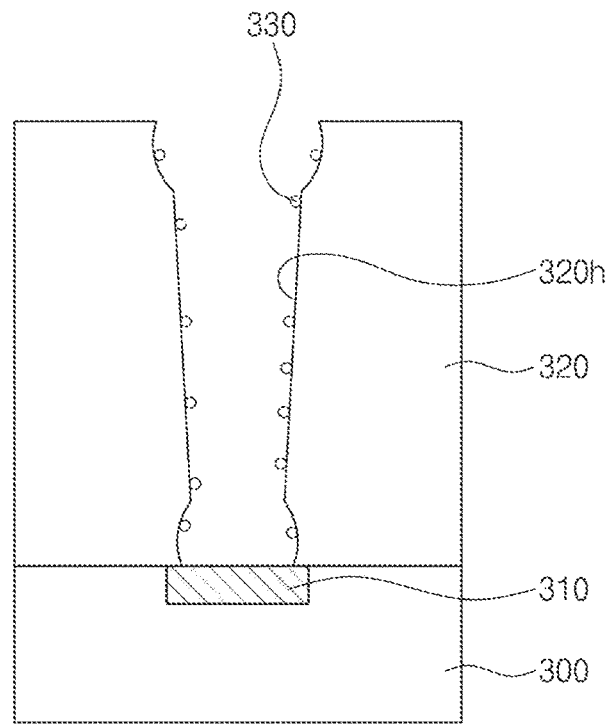
FIGS. 2A to 2C are sectional views illustrating a method of fabricating a semiconductor device according to some embodiments of the inventive concept.
Figure 2B:
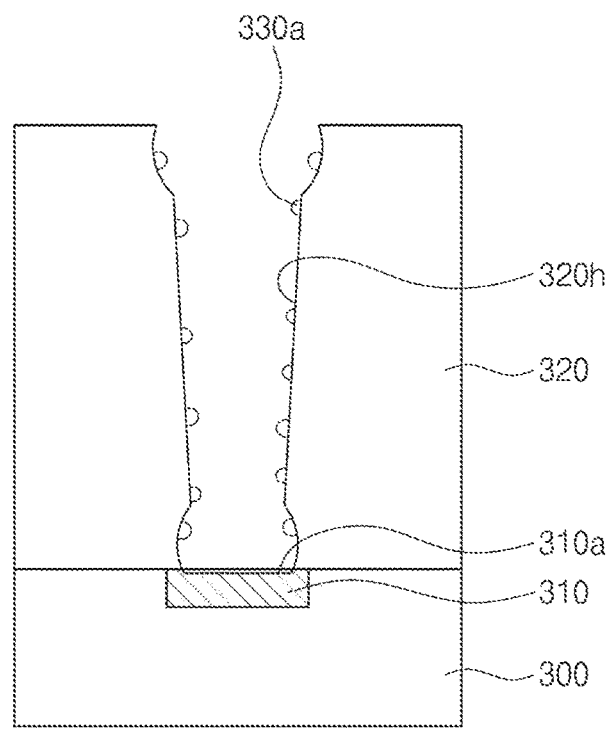
Figure 2C:
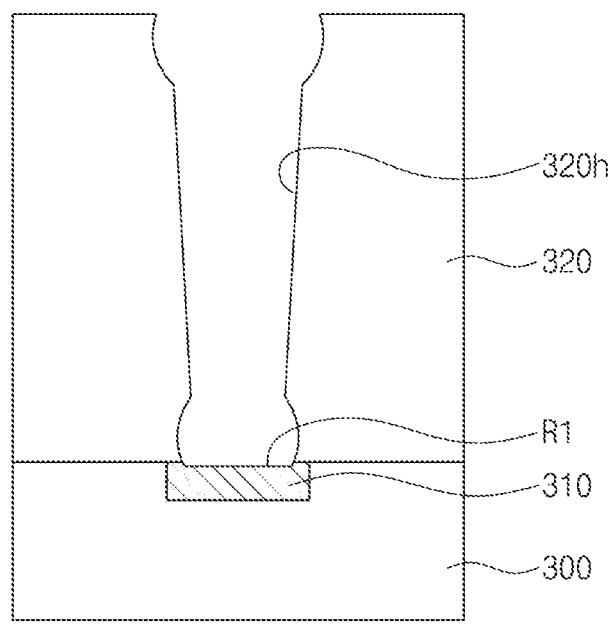

FIGS. 1A to 1C are process flow charts illustrating methods of fabricating a semiconductor device, according to some embodiments of the inventive concept. FIGS. 2A to 2C are sectional views illustrating a method of fabricating a semiconductor device according to some embodiments of the inventive concept.

Referring to FIGS. 1A and 2A, an upper structure 320 may be formed on a lower structure 300 including a copper pattern 310. The copper pattern 310 may be referred to as a metal or conductive pattern. The lower structure 300 may include an interlayered insulating layer, which extends on (e.g., covers) a semiconductor substrate or interconnection lines formed thereon. The copper pattern 310 may be electrically connected to at least a portion of the interconnection lines. The upper structure 320 may include at least one of a passivation layer, an insulating layer, or a semiconductor substrate. The copper pattern 310 may be located at the uppermost level of the lower structure 300. The uppermost level of the lower structure 300 may be included in a portion that is closest to the upper structure 320. It will be understood that "an element A covers an element B" (or similar language) means that the element A is on the element B but does not necessarily mean that the element A covers the element B entirely.

Thereafter, a wafer or substrate, which includes the lower structure 300, the copper pattern 310, and the upper structure 320, may be loaded in an etching chamber. An etching process may be performed to etch the upper structure 320, and as a result, a via hole 320h may be formed to expose the copper pattern 310 (in first step S10). In some embodiments, since a plasma density of an etching gas is high at an upper portion of the via hole 320h, the upper portion of the via hole 320h may be formed to be relatively wider than an intermediate portion of the via hole 320h as illustrated in FIG. 2A. Further, in some embodiments, at a lower portion of the via hole 320h, ions of particles constituting an etching gas may recoil from a surface of the copper pattern 310 and collide with a lower sidewall of the via hole 320h. Thus, the lower portion of the via hole 320h may be formed to be relatively wider than the intermediate portion of the via hole 320h as illustrated in FIG. 2A. Etch residues 330 may be left on an inner sidewall of the via hole 320h. The etch residues 330 may include, for example, a polymeric material.

Referring to FIGS. 1A and 2B, the etch residues 330 on the inner sidewall of the via hole 320h may be oxidized (in second step S20). The second step S20 may be performed by an oxidation process. The second step S20 may be performed in-situ in the etching chamber, after performing the first step S10. During the second step S20, oxygen may be supplied into the etching chamber. The second step S20 may be referred to as an ashing process. As a result of the second step S20, the etch residues 330 may be converted into oxidized etch residues 330a. At this time, a top surface of the copper pattern 310, which is exposed through a bottom of the via hole 320h, may be partially oxidized to form a copper oxide 310a. A portion of the copper oxide 310a may be formed by eroding an upper portion of the copper pattern 310. In some embodiments, the portion of the copper oxide 310a may be formed by oxidizing an upper portion of the copper pattern 310. If the second step S20 is not performed in an in-situ manner, the structure shown in FIG. 2A, in which the copper pattern 310 is not covered by another layer and thus is exposed, is transferred to another chamber, fabrication facilities may be contaminated by copper. According to some embodiments of the inventive concept, the second step S20 may be performed in an in-situ manner, and thus copper contamination may not occur. It will be understood that "two processes/steps being performed in-situ" (or similar language) means that the two processes are performed in a single process chamber or apparatus without transferring an object on which the two processes are performed (e.g., the structure shown in FIG. 2A) to outside of the single process chamber or apparatus.

Referring to FIGS. 1A and 2C, the oxidized etch residues 330a may be removed (in third step S30). The third step S30 may be performed by a cleaning process. The copper oxide 310a may also be removed during the third step S30. As a result of the removal of the copper oxide 310a, a recess region R1 may be formed in the top surface of the copper pattern 310. The third step S30 may be performed using, for example, a cleaning agent, which does not etch copper. In some embodiments, the third step S30 may be performed using a cleaning agent, in which aqueous ammonia ($NH_4OH$) and sulfuric acid ($H_2SO_4$) are not contained. For example, the cleaning agent in the third step S30 may include diluted HF (DHF), in which hydrofluoric acid (HF) and water are contained.

Thereafter, a cleaning process may be performed to clean a surface of the copper pattern 310 exposed through the bottom of the via hole 320h. In some embodiments, this cleaning process may be performed using a cleaning solution containing, for example, aqueous ammonia or sulfuric acid. In some embodiments, although not shown, a via plug may be formed in the via hole 320h.

In some embodiments, as provided in FIG. 1B, the fabricating methods may further include reducing copper oxide (in fourth step S40) after the third step S30 and before the step of forming the via plug. The fourth step S40 may be performed when, during the third step S30, the copper oxide 310a is incompletely removed and remains. In some embodiments, the fourth step S40 may include supplying hydrogen to produce hydrogen plasma and treating (e.g., reducing) the copper oxide 310a with the hydrogen plasma. The fourth step S40 may be referred to as an "active plasma treatment step" or "hydrogen plasma treatment step". Due to the fourth step S40, it may be possible to reduce all of the copper oxide 310a, which may be left after performing the previous step (e.g., the third step S30), to copper. Thus, the copper oxide 310a on the copper pattern 310 may disappear and be removed.

In some embodiments, as provided in FIGS. 1C and 2B, the fourth step S40 may be performed between the second step S20 and the third step S30. In other words, the copper oxide 310a, which is produced in the step of oxidizing the etch residue on the inner sidewall of the via hole 320h (in the second step S20), may be reduced to copper (in the fourth step S40), and then, the oxidized etch residues 330a may be removed (in the third step S30). In this case, the recess region R1 on the copper pattern 310 shown in FIG. 2C may not be formed.

It may be difficult to remove the etch residues 330, which remain on the inner sidewall of the via hole 320h, using a copper cleaning agent, and the etch residues 330 may weaken an adhesion strength between the via plug and a peripheral structure and may cause a failure in electric reliability of semiconductor devices. The fabricating methods according to some embodiments of the inventive concept may make it possible to remove (e.g., completely remove) the etch residues 330 and to improve electric reliability of semiconductor devices.

Next, some embodiments, in which the inventive concept is applied to a process of forming a through via, will be described.

FIG. 3 is a process flow chart illustrating a method of fabricating a semiconductor device according to some embodiments of the inventive concept. FIGS. 4A to 4G are sectional views illustrating a method of fabricating a semiconductor device according to some embodiments of the inventive concept. In some embodiments, the method of fabricating the semiconductor device may be sequentially performed as illustrated in FIGS. 4A to 4G.

Figure 4A:
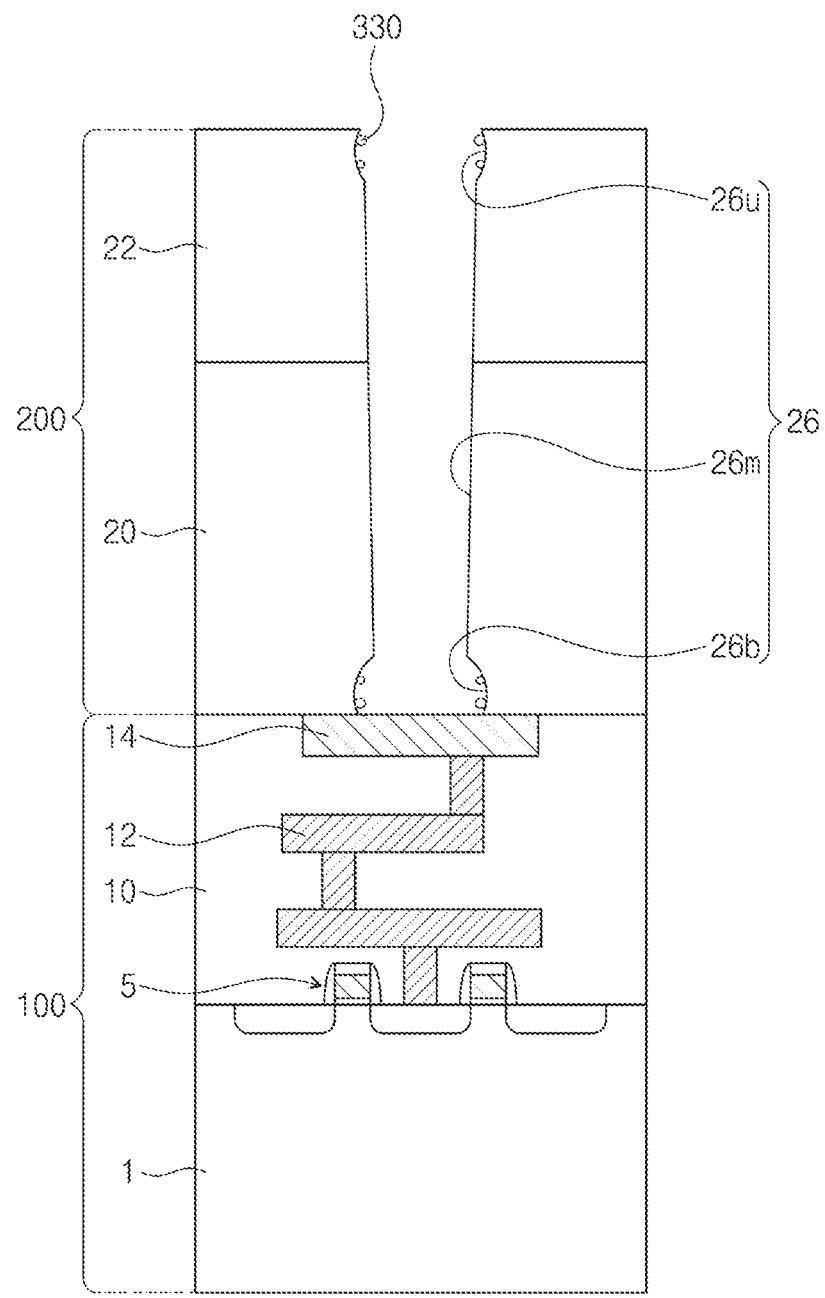
FIGS. 4A to 4G are sectional views illustrating a method of fabricating a semiconductor device according to some embodiments of the inventive concept.

Referring to FIGS. 3 and 4A, a first structure 100 may be prepared. The first structure 100 may include a first semiconductor substrate 1, first transistors 5 disposed on the first semiconductor substrate 1, a first interlayered insulating layer 10 that may have a multi-layered structure and may extend on (e.g., may cover) the first transistors 5, a first interconnection line 12 disposed in the first interlayered insulating layer 10, and a first metal pattern 14 electrically connected to the first interconnection line 12. Although a single first interconnection line 12 is shown in FIG. 4A, multiple first interconnection lines 12 may be provided in the first interlayered insulating layer 10. The first metal pattern 14 may be disposed at the top portion of the first structure 100 and may be exposed to the outside. The first metal pattern 14 may be formed of or include, for example, a precious metal, such as gold or copper. The first metal pattern 14 may be referred to as a precious metal pattern. In some embodiments, the first metal pattern 14 may be formed of or include, for example, at least one of aluminum, tungsten, tin, or lead. The first metal pattern 14 may be positioned at the topmost level of the first interlayered insulating layer 10. The first metal pattern 14 may be positioned in the first interlayered insulating layer 10 and may be covered with a portion of the first interlayered insulating layer 10.

A second structure 200 may be attached (e.g., bonded) to the first structure 100. In some embodiments, the first metal pattern 14 may be exposed before the second structure 200 is attached to the first structure 100. The second structure 200 may include a second semiconductor substrate 22 and a second interlayered insulating layer 20. For example, to attach (e.g., bond) the second structure 200 to the first structure 100, a plasma treatment process may be performed on a surface of at least one of the first interlayered insulating layer 10 and the second interlayered insulating layer 20. Thereafter, the second interlayered insulating layer 20 may be placed on the first interlayered insulating layer 10 to be in contact with the first interlayered insulating layer 10, and then, a thermo-compression process may be performed to attach (e.g., bond) them to each other. In some embodiments, although not shown, a transistor or an interconnection line may be formed on the second semiconductor substrate 22.

The second structure 200 may be etched in an etching chamber to form a via hole 26 exposing the first metal pattern 14 (in first step S11). The via hole 26 may include an upper via hole 26u, a lower via hole 26b, and an intermediate via hole 26m therebetween. The upper via hole 26u may be exposed to a high density of etching plasma, and thus, the upper via hole 26u may be formed to be wider than the intermediate via hole 26m. The lower via hole 26b may be additionally etched by ions of etching gas particles, which recoil from a surface of the first metal pattern 14 exposed through the bottom of the via hole 26 and collide with an inner sidewall of the via hole 26, and thus, may be formed to be wider than the intermediate via hole 26m. First etch residues 330 may be produced by the etching process. The first etch residues 330 may be mainly formed on the inner sidewalls of the upper and lower via holes 26u and 26b, which are laterally recessed.

Figure 4B:
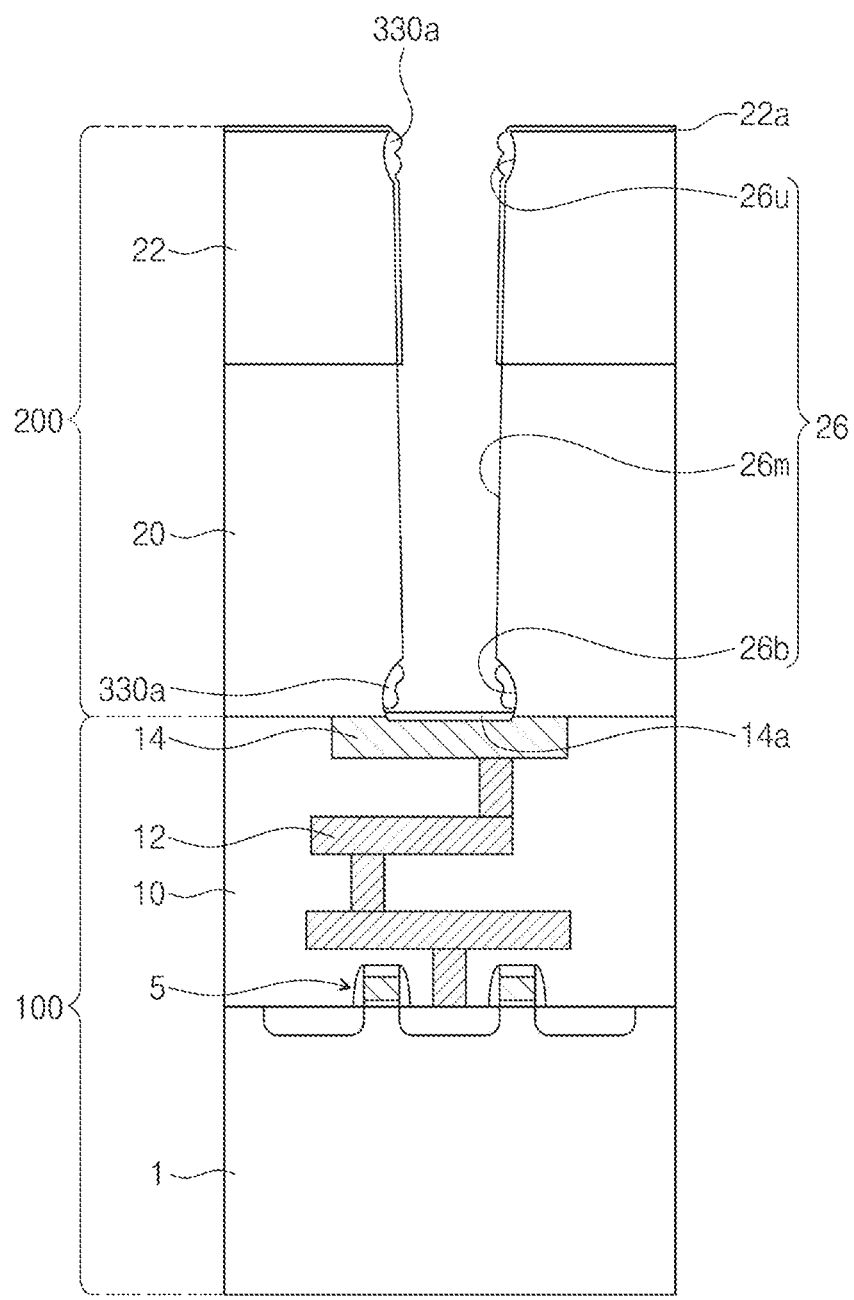

Referring to FIGS. 3 and 4B, the first etch residue 330 on the inner sidewall of the via hole 26 may be oxidized (in second step S12). The second step S12 may be performed by an oxidation process. The second step S12 may be performed in-situ in the etching chamber, after performing the first step S11. During the second step S12, oxygen may be supplied into the etching chamber. The second step S12 may be referred to as an ashing process. As a result of the second step S12, the first etch residues 330 may be converted into oxidized first etch residues 330a, which are formed by oxidizing the first etch residues 330. Here, a top surface of the first metal pattern 14, which is exposed through the bottom of the via hole 26, may also be partly oxidized to form a first metal oxide 14a. In the case where the first metal pattern 14 includes copper, the first metal oxide 14a may be copper oxide. In the second step S12, the surface of the second semiconductor substrate 22 may also be oxidized to form a first substrate oxide 22a.

Figure 4C:
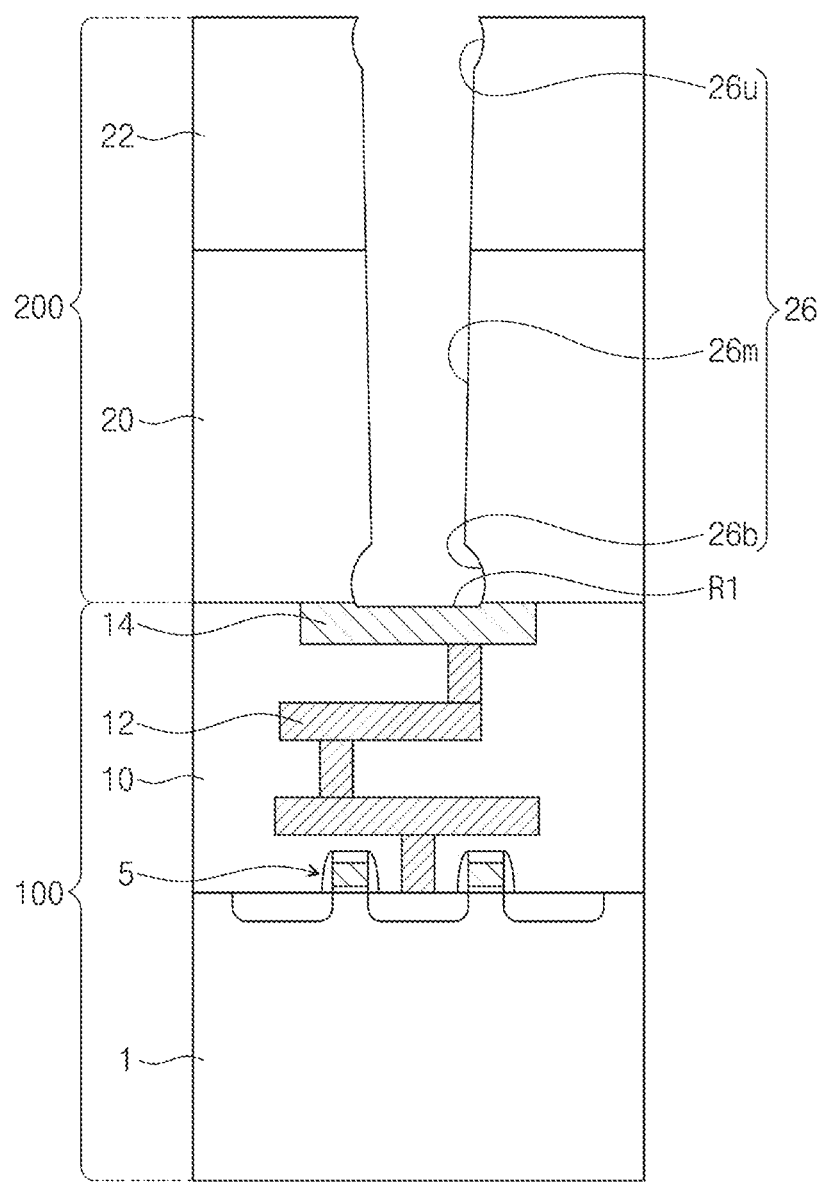

Referring to FIGS. 3 and 4C, the oxidized first etch residues 330a may be removed (in third step S13). The third step S13 may be performed by a cleaning process. The first metal oxide 14a and the first substrate oxide 22a may also be removed during the third step S13. As a result of the removal of the first metal oxide 14a, a first recess region R1 may be formed in the top surface of the first metal pattern 14. In some embodiments, the third step S13 may be performed using a cleaning agent, which does not etch copper. In some embodiments, the third step S13 may be performed using a cleaning agent, in which aqueous ammonia ($NH_4OH$) and sulfuric acid ($H_2SO_4$) are not contained. For example, the cleaning agent in the third step S13 may include diluted HF (DHF), in which hydrofluoric acid (HF) and water are contained.

Figure 4D:
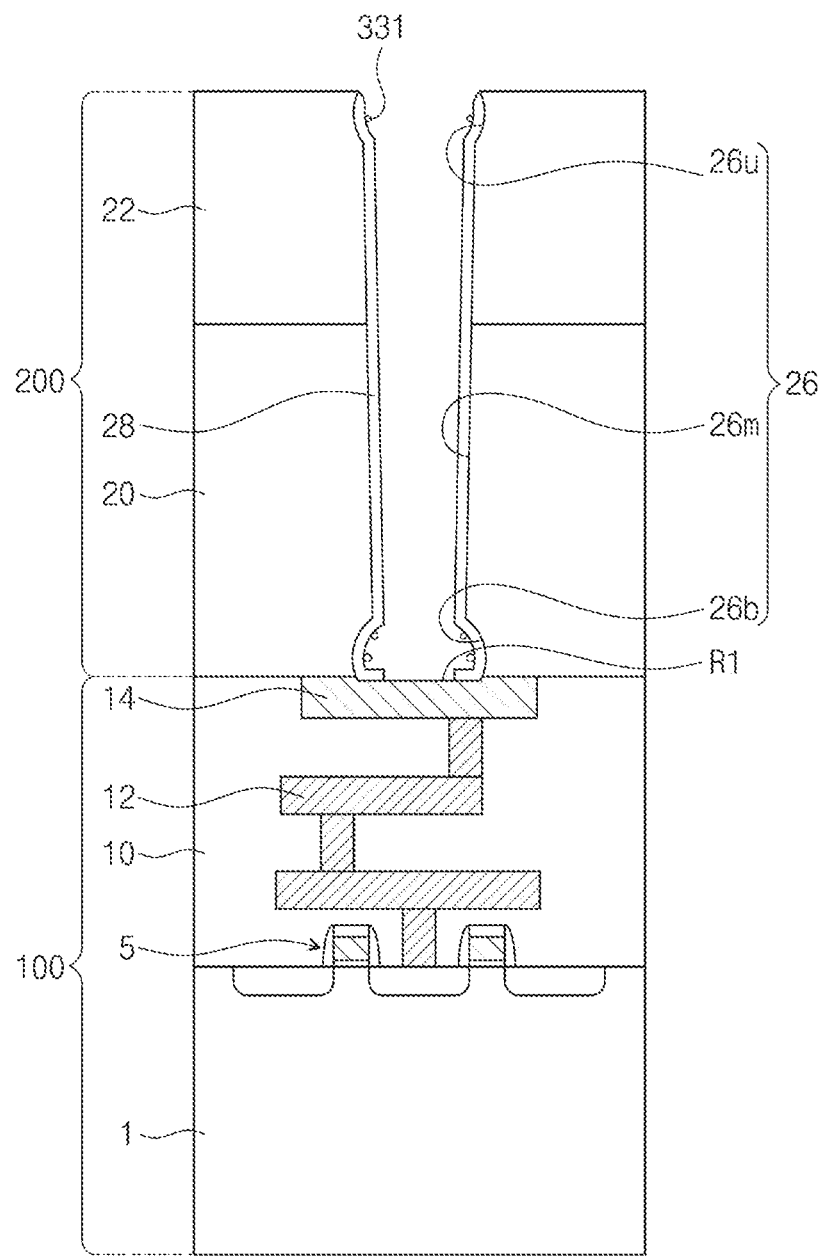

Referring to FIGS. 3 and 4D, a via insulating layer 28 may be formed on (e.g., formed to cover) the inner sidewall of the via hole 26 (in fourth step S14). To do this, in some embodiments, the via insulating layer 28 may be conformally formed on the structure of FIG. 4C, and then, in an etching chamber, an anisotropic etching process may be performed on the via insulating layer 28 to form the via insulating layer 28 extending on only the sidewall of the via hole 26. Thus, the top surface of the first metal pattern 14 may be exposed through the bottom of the via hole 26 as the via insulating layer 28 is not provided on a portion of the top surface of the first metal pattern 14. In some embodiments, the via insulating layer 28 may have a uniform thickness along the inner sidewall of the via hole 26 as illustrated in FIG. 4D. A lower portion of the via insulating layer 28 may protrude laterally and may cover a portion of the top surface of the first metal pattern 14 as illustrated in FIG. 4D. As a result of the anisotropic etching process, second etch residues 331 may be formed on the via insulating layer 28 that extends on the inner sidewall of the via hole 26. The via insulating layer 28 may be formed of or include at least one of, for example, silicon oxide, silicon nitride, or silicon oxynitride.

Figure 4E:
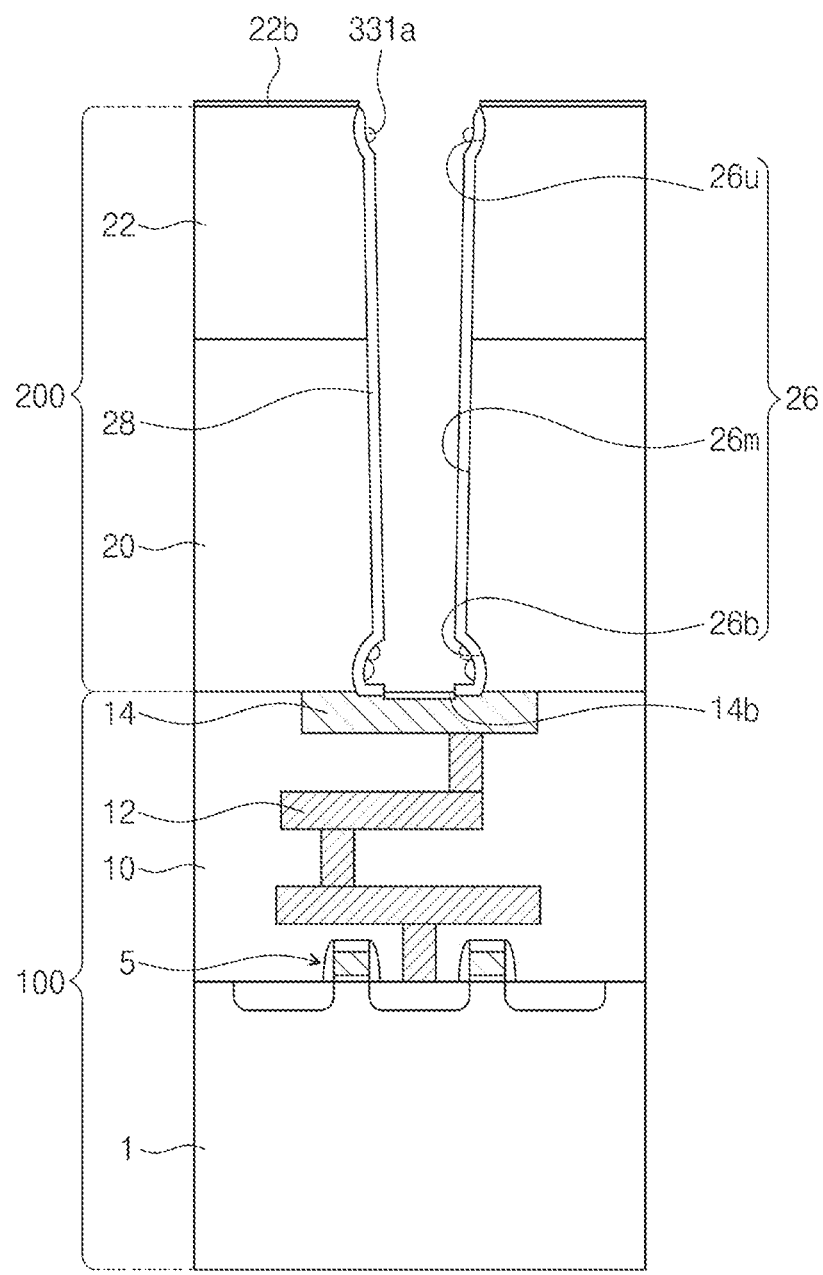

Referring to FIGS. 3 and 4E, the second etch residues 331 on the inner sidewall of the via hole 26 may be oxidized (in fifth step, S15). The fifth step S15 may be performed by an oxidation process. The fifth step S15 may be performed in-situ in the etching chamber, after performing the fourth step S14. During the fifth step S15, oxygen may be supplied into the etching chamber. The fifth step S15 may be referred to as an ashing process. As a result of the fifth step S15, the second etch residues 331 may be converted into oxidized second etch residues 331*a*, which are formed by oxidizing the second etch residues 331. Here, a top surface of the first metal pattern 14, which is exposed through the bottom of the via hole 26, may also be partly oxidized to form a second metal oxide 14*b*. In the case where the first metal pattern 14 includes copper, the second metal oxide 14*b* may be copper oxide. In the fifth step S15, the surface of the second semiconductor substrate 22 may also be oxidized to form a second substrate oxide 22*b*.

Figure 4F:
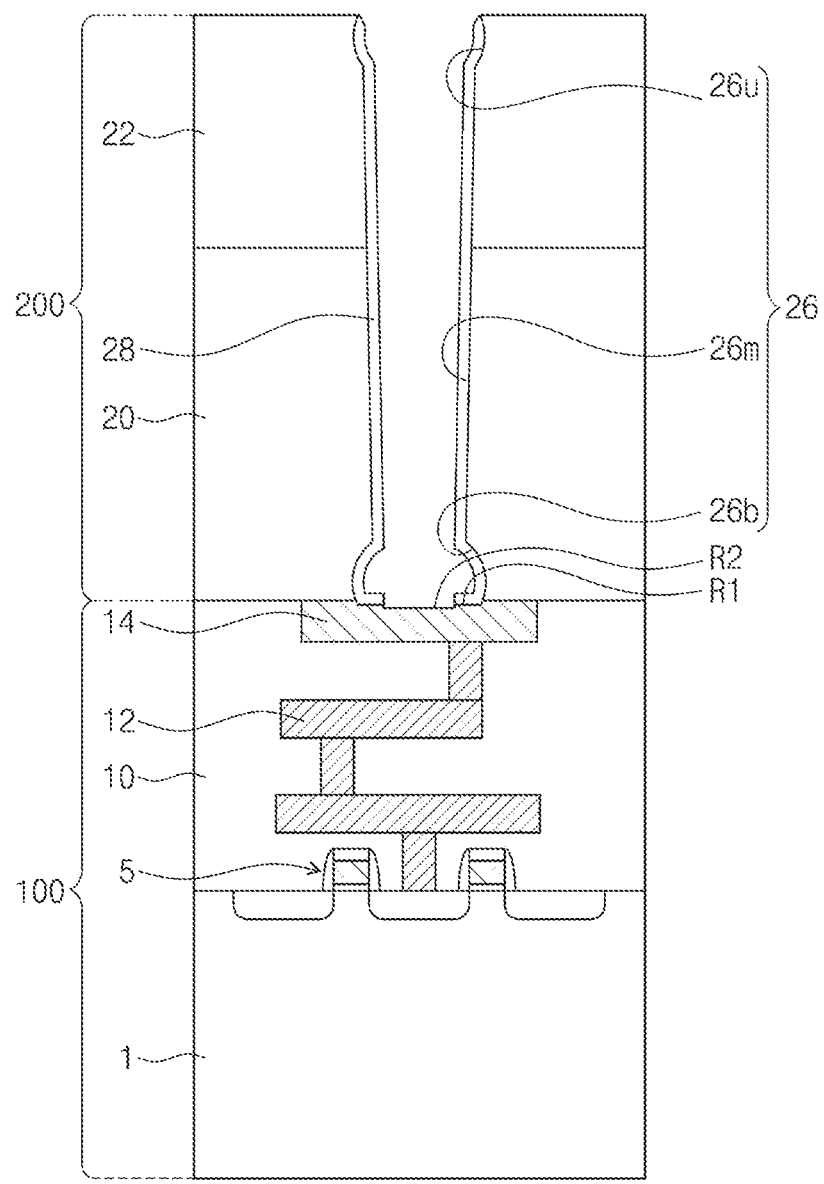

Referring to FIGS. 3 and 4F, the oxidized second etch residues 331*a* may be removed (in sixth step S16). The sixth step S16 may be performed by a cleaning process. The second metal oxide 14*b* and the second substrate oxide 22*b* may also be removed during the sixth step S16. As a result of the removal of the second metal oxide 14*b*, a second recess region R2 may be formed in the top surface of the first metal pattern 14. The second recess region R2 may be deeper than the first recess region R1. In some embodiments, the sixth step S16 may be performed using a cleaning agent, which does not etch copper. In some embodiments, the sixth step S16 may be performed using a cleaning agent, in which aqueous ammonia ($NH_4OH$) and sulfuric acid ($H_2SO_4$) are not contained. For example, the cleaning agent in the sixth step S16 may include diluted HF (DHF), in which hydrofluoric acid (HF) and water are contained.

Figure 4G:
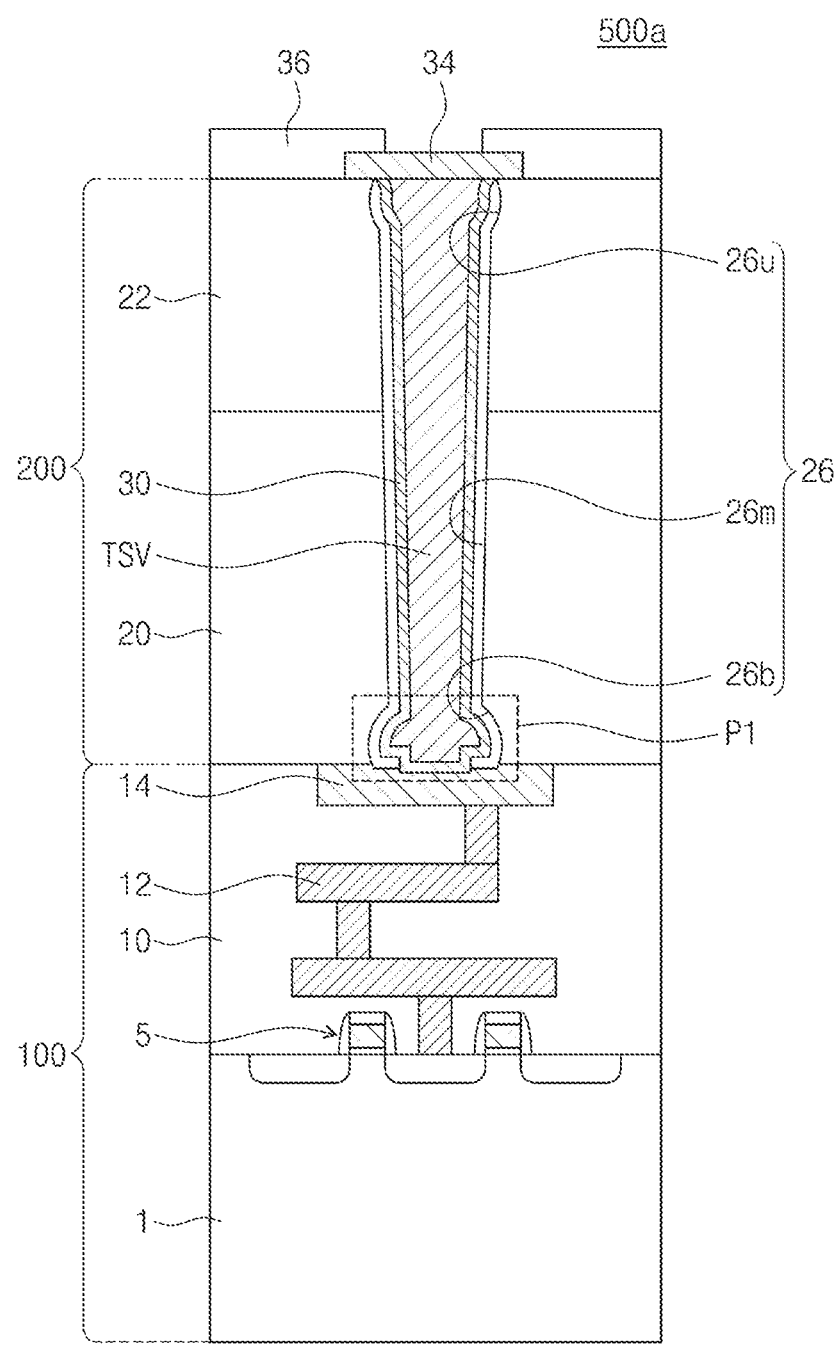

Referring to FIGS. 3 and 4G, the surface of the first metal pattern 14 may be cleaned (in seventh step S17). This cleaning process may be performed using a cleaning solution containing, for example, aqueous ammonia or sulfuric acid. A diffusion barrier layer 30 may be conformally formed to extend on (e.g., cover) the side and bottom surfaces of the via hole 26, and a conductive layer may be formed to fill the via hole 26. A chemical mechanical polishing (CMP) process or an etch-back process may be performed to remove the diffusion barrier layer 30 and the conductive layer on the second semiconductor substrate 22 and to remain the diffusion barrier layer 30 in the via hole 26, and as a result, a through via TSV may be formed (in eighth step S18). The through via TSV may be formed of or include, for example, at least one of tungsten, aluminum, or copper. The diffusion barrier layer 30 may be formed of or include, for example, a metal nitride layer (e.g., a titanium nitride layer, a tantalum nitride layer, or a tungsten nitride layer). Next, a second metal pattern 34 may be formed to be in contact with the through via TSV, and a passivation layer 36 may be formed on the second semiconductor substrate 22 to extend on (e.g., cover) the second metal pattern 34. The second metal pattern 34 may be formed of or include, for example, aluminum or tungsten. The passivation layer 36 may be formed of or include, for example, at least one of silicon oxide, silicon nitride, or silicon oxynitride. As a result, a semiconductor device 500*a* according to some embodiments of the inventive concept may be formed.

Although not shown, the step of reducing the copper oxide (in S40 of FIG. 1B or 1C) or the active plasma treatment step may be performed between the third and fourth steps S13 and S14 of FIG. 3 and/or between the second and third steps S12 and S13 of FIG. 3 to reduce the first metal oxide 14*a*. In some embodiments, the step of reducing the copper oxide (in S40 of FIG. 1B or 1C) or the active plasma treatment step may be performed between the sixth and seventh steps S16 and S17 of FIG. 3 and/or between the fifth and sixth steps S15 and S16 of FIG. 3 to reduce the second metal oxide 14*b*. As used herein the term "and/or" includes any and all combinations of one or more of the associated listed items.

Figure 5A:
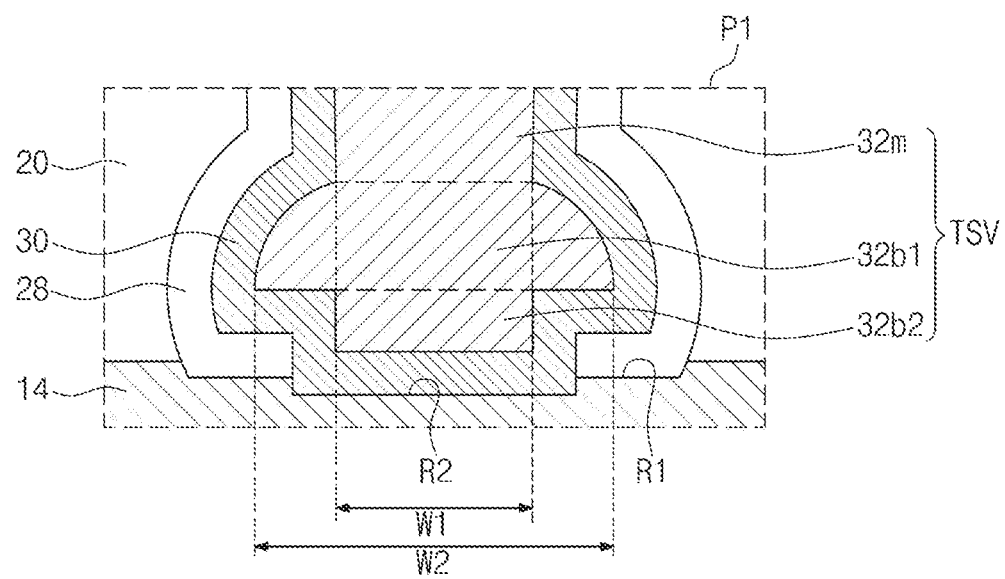
FIGS. 5A and 5B are enlarged sectional views illustrating a portion of a semiconductor device (e.g., a portion 'P1' of FIG. 4G), according to some embodiments of the inventive concept.
Figure 5B:
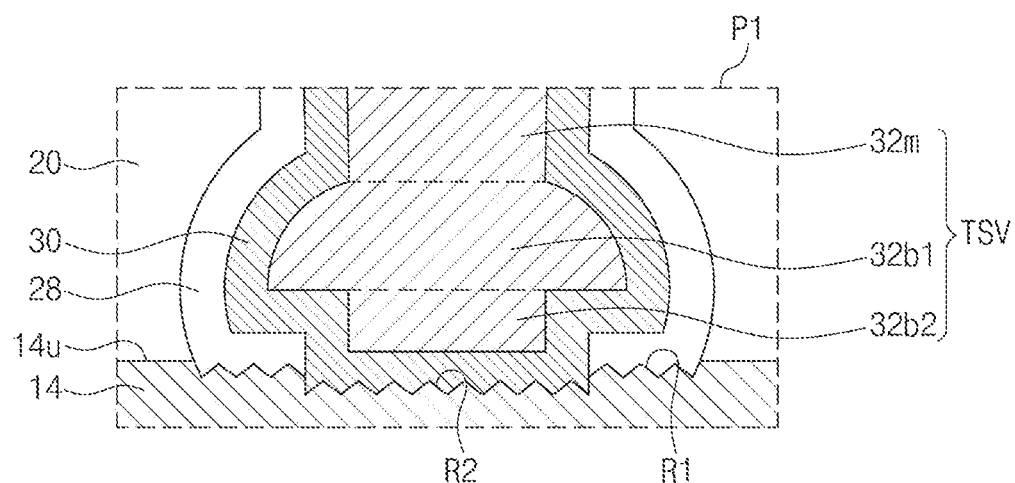

A structure of a semiconductor device, which is fabricated through the afore-described process, will be described in more detail below. FIGS. 5A and 5B are enlarged sectional views illustrating a portion of a semiconductor device (e.g., a portion 'P1' of FIG. 4G), according to some embodiments of the inventive concept.

Referring to FIGS. 4G and 5A, the semiconductor device 500*a* according to some embodiments of the inventive concept may include a first structure 100 including a first metal pattern 14 and a second structure 200 extending on (e.g., covering) the first structure 100. In FIG. 4G, the first metal pattern 14 is illustrated to be a single pattern, but in some embodiments, the first metal pattern 14 may be composed of a plurality of sub metal patterns spaced apart from each other. In some embodiments, the first metal pattern 14 may be formed of or include copper. A through via TSV may penetrate the second structure 200 and may be electrically connected to the first metal pattern 14. The top surface of the first metal pattern 14 may be provided to have a first recess region R1 and a second recess region R2. The second recess region R2 may be placed at a center region of a bottom of the first recess region R1. The through via TSV may include an intermediate portion 32*m*, a first lower portion 32*b*1 placed below the intermediate portion 32*m*, and a second lower portion 32*b*2 placed below the first lower portion 32*b*1. The second lower portion 32*b*2 may be positioned between the first lower portion 32*b*1 and the first metal pattern 14. A sidewall of a lower portion of the first lower portion 32*b*1 may protrude in a lateral direction toward the second interlayered insulating layer 20 beyond a sidewall of the second lower portion 32*b*2. A bottom surface of the first lower portion 32*b*1 may not be veiled by the second lower portion 32*b*2 and may be laterally exposed by the second lower portion 32*b*2. The first lower portion 32*b*1 may have a first width W1 at a level adjacent to the intermediate portion 32*m* and may have a second width W2 at a level adjacent to the second lower portion 32*b*2. The first width W1 may be smaller than the second width W2. A lower portion of a via insulating layer 28 may be interposed between the first metal pattern 14 and a diffusion barrier layer 30.

Referring to FIG. 5B, the first metal pattern 14 may have a first surface roughness at the bottoms of the first and second recess regions R1 and R2 and a second surface roughness on a top surface 14u of the first metal pattern 14, and here, the first surface roughness may be greater than the second surface roughness. The first surface roughness may be higher than the second surface roughness because of at least one of the ashing processes S12 and S15 and the removal processes S13 and S16, which are described with reference to FIG. 3. Except for this difference, the structure of FIG. 5B may be substantially the same as that of FIG. 5A. In some embodiments, portions of the first metal pattern 14 that define the first and second recess regions R1 and R2 may have surfaces that are rougher than the top surface 14u of the first metal pattern 14 contacting the second interlayered insulating layer 20 as illustrated in FIG. 5B.

The semiconductor device 500a may be a part of a semiconductor package. In other words, the first structure 100 may be a part of a lower semiconductor chip. The second structure 200 may be a part of an upper semiconductor chip. The semiconductor device 500a may be a semiconductor package, in which the lower semiconductor chip and the upper semiconductor chip is connected to each other by the through via TSV. In the semiconductor device 500a, the etch residues 330 and 331 may be totally removed, and thus, it may be possible to improve an adhesion strength between the through via TSV and a peripheral structure and to improve the reliability of the semiconductor device.

Figure 6:
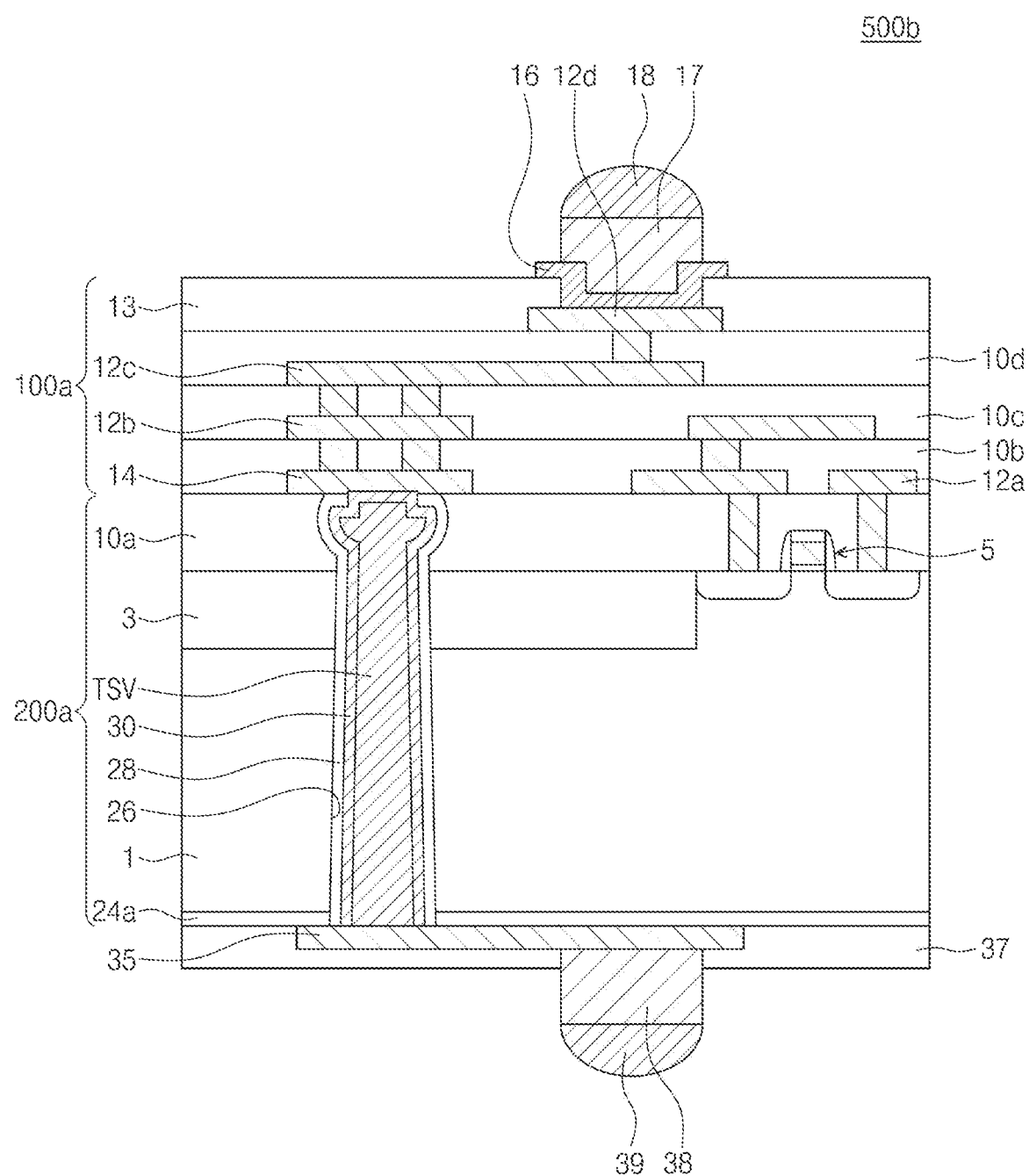
FIG. 6 is a sectional view illustrating a semiconductor device according to some embodiments of the inventive concept.

FIG. 6 is a sectional view illustrating a semiconductor device according to some embodiments of the inventive concept.

Referring to FIG. 6, a semiconductor device 500b according to some embodiments of the inventive concept may include a second structure 200a and a first structure 100a, which is disposed on the second structure 200a. The second structure 200a may include a semiconductor substrate 1, a device isolation layer 3, a transistor 5, and a first interlayered insulating layer 10a. The second structure 200a may further include a first capping layer 24a extending on (e.g., covering) a bottom surface of the semiconductor substrate 1.

The first structure 100a may include conductive patterns 14 and 12a to 12d, second to fourth interlayered insulating layers 10b to 10d, and an upper passivation layer 13. The conductive patterns 14 and 12a to 12d may include a first metal pattern 14, a second conductive pattern 12a, a third conductive pattern 12b, a fourth conductive pattern 12c, and a fifth conductive pattern 12d. The first metal pattern 14 and the second conductive pattern 12a may be placed at the same height and may be spaced apart from each other. The second conductive pattern 12a may be electrically connected to the transistor 5.

A conductive pad 16 may be disposed on the fifth conductive pattern 12d. An upper conductive pillar 17 may be disposed on the conductive pad 16. An upper conductive bump 18 may be disposed on the upper conductive pillar 17.

A through via TSV may penetrate the second structure 200a and may be in contact with the first metal pattern 14. In some embodiments, the through via TSV may have the same or similar shape as that described with reference to FIGS. 4G, 5A, and 5B. The through via TSV may be provided in a via hole 26. An inner sidewall of the via hole 26 may be covered with a via insulating layer 28. A diffusion barrier layer 30 may be interposed between the via insulating layer 28 and the through via TSV.

A redistribution pattern 35 may be provided below the first capping layer 24a. The redistribution pattern 35 may be in contact with the through via TSV. The first capping layer 24a may be covered with a second capping layer 37. A portion of the redistribution pattern 35 may be in contact with a lower conductive pillar 38. The lower conductive pillar 38 may be provided to penetrate the second capping layer 37 and may protrude toward the outside. A lower conductive bump 39 may be provided below the lower conductive pillar 38.

The semiconductor device 500b of FIG. 6 may be formed by the following process. First, a device isolation layer 3 may be formed in a semiconductor substrate 1. Transistors 5 may be formed on the semiconductor substrate 1. A first interlayered insulating layer 10a may be formed to extend on (e.g., cover) the semiconductor substrate 1. A first metal pattern 14 and a second conductive pattern 12a may be formed on the first interlayered insulating layer 10a. A second interlayered insulating layer 10b, a third conductive pattern 12b, a third interlayered insulating layer 10c, a fourth conductive pattern 12c, a fourth interlayered insulating layer 10d, and a fifth conductive pattern 12d may be sequentially formed on the first metal pattern 14 and the second conductive pattern 12a. An upper passivation layer 13 may be formed on the fifth conductive pattern 12d and may be patterned to expose the fifth conductive pattern 12d. A conductive pad 16 may be formed on the upper passivation layer 13 to be in contact with the fifth conductive pattern 12d. An upper conductive pillar 17 and an upper conductive bump 18 may be formed on the conductive pad 16.

Thereafter, a first capping layer 24a may be formed on a bottom surface of the semiconductor substrate 1. The first capping layer 24a and the second structure 200a may be sequentially and anisotropically etched to form a via hole 26 exposing the first metal pattern 14. Next, a through via TSV may be formed using the method described with reference to FIG. 3. A redistribution pattern 35 may be formed below the first capping layer 24a to be in contact with the through via TSV. A second capping layer 37 may be formed below the first capping layer 24a to cover the redistribution pattern 35. Thereafter, a lower conductive pillar 38 and a lower conductive bump 39 may be formed.

In fabrication methods of a semiconductor device with a through via according to some embodiments of the inventive concept, an etch residue may be effectively removed, and thus, it may be possible to improve reliability of the fabrication method. In addition, according to some embodiments of the inventive concept, it may be possible to provide a semiconductor device with improved reliability.

The functions/acts of flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

While example embodiments of the inventive concept have been particularly shown and described, it will be understood by one of ordinary skill in the art that variations may be made therein without departing from the scope of the attached claims.

What is claimed is:
1. A semiconductor device, comprising:
a first structure comprising:
a first semiconductor substrate;
first transistors on the first semiconductor substrate;

a first interlayered insulating layer covering the first transistors;

first interconnection lines in the first interlayered insulating layer; and a first metal pattern electrically connected to the first interconnection lines;

a second structure covering the first structure and comprising:

a second interlayered insulating layer covering the first interlayered insulating layer; and a second semiconductor substrate on the second interlayered insulating layer;

a via hole penetrating the second structure, wherein a top surface of the first metal pattern is exposed by the via hole;

a via insulating layer in the via hole;

a diffusion barrier layer on the via insulating layer; and a through via in a remaining portion of the via hole and electrically connected to the first metal pattern, wherein the top surface of the first metal pattern comprises a recess, the recess comprises a first recess and a second recess, and the second recess is at a center region of a bottom of the first recess, and a depth of the second recess is deeper than a depth of the first recess.

2. The semiconductor device of claim 1, further comprising:

a second metal pattern electrically connected to the through via; and a passivation layer on the second semiconductor substrate and covering the second metal pattern.

3. The semiconductor device of claim 1, wherein the via hole comprises an upper via hole, a lower via hole and an intermediate via hole between the upper via hole and the lower via hole, and each of the upper via hole and the lower via hole is wider than the intermediate via hole.

4. The semiconductor device of claim 1, wherein a lower portion of the via insulating layer protrudes laterally and covers a portion of the top surface of the first metal pattern.

5. The semiconductor device of claim 1, wherein the through via comprises a first lower portion and a second lower portion, the second lower portion is between the first lower portion and the first metal pattern, and a bottom surface of the first lower portion is exposed in a lateral direction of the second lower portion.

6. The semiconductor device of claim 5, wherein the first lower portion has a first width at a level adjacent to an upper portion of the through via and has a second width at a level adjacent to the second lower portion, and the first width is narrower than the second width.

7. The semiconductor device of claim 1, wherein the first metal pattern has a first surface roughness at a bottom of the recess, the top surface of the first metal pattern has a second surface roughness outside the recess, and the first surface roughness is greater than the second surface roughness.

8. A semiconductor device, comprising:

a first structure including a metal pattern;

a second structure covering the first structure;

a via hole penetrating the second structure, wherein a top surface of the metal pattern is exposed by the via hole;

a via insulating layer covering an inner sidewall of the via hole;

a through via on the via insulating layer and electrically connected to the metal pattern; and a diffusion barrier layer between the through via and the via insulating layer, wherein the through via comprises a first lower portion and a second lower portion, the second lower portion is between the first lower portion and the metal pattern, a bottom surface of the first lower portion is exposed in a lateral direction of the second lower portion, and the via insulating layer extends between the bottom surface of the first lower portion and the metal pattern.

9. The semiconductor device of claim 8, wherein the first lower portion has a first width at a level adjacent to an upper portion of the through via and has a second width at a level adjacent to the second lower portion, and the first width is narrower than the second width.

10. The semiconductor device of claim 8, wherein a lower portion of the via insulating layer is between the top surface of the metal pattern and the diffusion barrier layer.

11. The semiconductor device of claim 8, wherein the top surface of the metal pattern comprises a recess, and the recess comprises a first recess and a second recess, and the second recess is at a center region of a bottom of the first recess.

12. The semiconductor device of claim 11, wherein a depth of the second recess is deeper than a depth of the first recess.

13. The semiconductor device of claim 11, wherein a lower portion of the via insulating layer is in contact with the bottom of the first recess, and the diffusion barrier layer is in contact with a bottom of the second recess.

14. The semiconductor device of claim 8, the via insulating layer includes at least one of silicon oxide, silicon nitride and silicon oxynitride, and the diffusion barrier layer includes a metal nitride layer.

15. A semiconductor device, comprising:

a first structure including a metal pattern;

a second structure covering the first structure;

a through via penetrating the second structure, the through via being electrically connected to the metal pattern, a diffusion barrier layer between the through via and the second structure; and a via insulating layer between the diffusion barrier layer and the second structure, wherein a top surface of the metal pattern comprises a recess, the metal pattern has a first surface roughness at a bottom of the recess, the top surface of the metal pattern has a second surface roughness outside the recess, and the first surface roughness is greater than the second surface roughness.

16. The semiconductor device of claim 15, wherein the recess comprises a first recess and a second recess, and the second recess is at a center region of a bottom of the first recess, and a depth of the second recess is deeper than a depth of the first recess.

17. The semiconductor device of claim 16, wherein a lower portion of the via insulating layer is in contact with the bottom of the first recess, and the diffusion barrier layer is in contact with a bottom of the second recess.

18. The semiconductor device of claim 15, wherein a lower portion of the via insulating layer protrudes laterally and covers a portion of the top surface of the metal pattern.

19. The semiconductor device of claim 15, wherein the through via comprises a first lower portion and a second lower portion,
- the second lower portion is between the first lower portion and the metal pattern, and
- a bottom surface of the first lower portion is exposed in a lateral direction of the second lower portion.

20. The semiconductor device of claim 19, wherein the first lower portion has a first width at a level adjacent to an upper portion of the through via and has a second width at a level adjacent to the second lower portion, and
- the first width is narrower than the second width.

* * * * *